(12) United States Patent
Adkisson et al.

(10) Patent No.: US 6,797,553 B2
(45) Date of Patent: Sep. 28, 2004

(54) METHOD FOR MAKING MULTIPLE THRESHOLD VOLTAGE FET USING MULTIPLE WORK-FUNCTION GATE MATERIALS

(75) Inventors: James W Adkisson, Jericho, VT (US); Arne W. Ballantine, Round Lake, NY (US); Ramachandra Divakaruni, Somers, NY (US); Jeffrey B. Johnson, Essex Junction, VT (US); Erin C. Jones, Tuckahoe, NY (US); Hon-Sum P. Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/205,143

(22) Filed: Jul. 24, 2002

(65) Prior Publication Data

US 2002/0177279 A1 Nov. 28, 2002

Related U.S. Application Data

(62) Division of application No. 09/695,199, filed on Oct. 24, 2000, now Pat. No. 6,448,590.

(51) Int. Cl.[7] .......................................... H01L 21/8238
(52) U.S. Cl. ................................... 438/202; 438/209
(58) Field of Search ......................................... 438/289

(56) References Cited

U.S. PATENT DOCUMENTS

| | | |
|---|---|---|
| 4,745,079 A | 5/1988 | Pfiester |
| 4,786,611 A | 11/1988 | Pfiester |
| 4,845,047 A | 7/1989 | Holloway et al. |
| 5,600,169 A | 2/1997 | Burgener et al. |
| 5,923,984 A * | 7/1999 | Gardner et al. ............. 438/289 |
| 5,932,919 A | 8/1999 | Schwalke |
| 5,933,721 A | 8/1999 | Hause et al. |
| 5,942,786 A * | 8/1999 | Sheu et al. ................. 257/390 |
| 5,952,701 A | 9/1999 | Bulucea et al. |
| 6,069,037 A | 5/2000 | Liao |
| 6,083,836 A | 7/2000 | Rodder |
| 6,166,404 A * | 12/2000 | Imoto et al. ................ 257/279 |
| 6,171,910 B1 * | 1/2001 | Hobbs et al. ............... 438/257 |
| 6,417,548 B1 * | 7/2002 | Sheu et al. ................. 257/391 |

* cited by examiner

*Primary Examiner*—David Nelms
*Assistant Examiner*—Thao P. Le
(74) *Attorney, Agent, or Firm*—DeLio & Peterson; Robert Curcio; Richard A. Henkler

(57) ABSTRACT

A shorter gate length FET for very large scale integrated circuit chips is achieved by providing a wafer with multiple threshold voltages. Multiple threshold voltages are developed by combining multiple work function gate materials. The gate materials are geometrically aligned in a predetermined pattern so that each gate material is adjacent to other gate materials. A patterned linear array embodiment is developed for a multiple threshold voltage design. The method of forming a multiple threshold voltage FET requires disposing different gate materials in aligned trenches within a semiconductor wafer, wherein each gate material represents a separate work function. The gate materials are arranged to be in close proximity to one another to accommodate small gate length designs.

17 Claims, 6 Drawing Sheets

METHOD FOR MAKING MULTIPLE THRESHOLD VOLTAGE FET USING MULTIPLE WORK-FUNCTION GATE MATERIALS

This is a divisional of application Ser. No. 09/695,199 filed on Oct. 24, 2000 now U.S. Pat. No. 6,448,590.

BACKGROUND OF THE INVENTION

1. Field of the Invention

The present invention relates to an electronic semiconductor device and method of fabrication, particularly to voltage threshold adjustment for field effect transistors (FETs), and more particularly to the combination of geometry and multiple gate materials used to establish a total work function for a predetermined threshold voltage during gate fabrication.

2. Description of Related Art

The voltage threshold for a field effect transistor, for example a metal-oxide-semiconductor (MOSFET), is the gate voltage necessary to initiate conduction. Generally, a FET has a significant disadvantage in that the threshold voltage, VT, usually varies with respect to geometry, the channel length L, and the drain bias. In a polysilicon gate FET, the type of doping in the polysilicon of the gate electrode has a large influence on the threshold voltage. The polysilicon is typically heavily doped to achieve low resistivity. The Fermi energy of heavily doped (n-type) polysilicon is close to the energy at the edge of the conduction band of silicon. The work function of a material is the difference between the vacuum energy level and the Fermi energy level of the material. In general, the positive gate voltage of an n-channel device must be larger than some threshold voltage before a conducting channel can be induced. Similarly, the negative gate voltage of a p-channel device must be more negative than some threshold voltage to induce the required positive charge in the channel.

As gate lengths scale below 50 nm, FET scaling becomes limited by the finite depth of the gate control. As the channel length, L, decreases, there is a considerable problem with a diminishing threshold voltage, VT. This effect severely impairs device performance and makes it difficult to design integrated circuits with short channel lengths. This problem with threshold voltage control is not apparent until the channel length approaches submicron levels As very large scale integration (VLSI) processes are used to make FETs, the channel lengths become shorter and the gate oxides become thinner, and a higher doping level under the gate in the channel region is required to provide the desired threshold and subthreshold voltage characteristics. However, dopant diffusion from a gate electrode into an underlying channel region may affect the device parameters of the FET, including the threshold voltage.

Some resolutions to this problem include adjusting the threshold voltage by diffusion, doping polysilicon to different conductivity types, and modifying the gate work function difference. For example, in U.S. Pat. No. 4,786,611 issued to Pfiester on 22 Nov. 1988, entitled, "ADJUSTING THRESHOLD VOLTAGES BY DIFFUSION THROUGH REFRACTORY METAL SILICIDES," a method for adjusting threshold voltages by diffusing impurities is taught. This adjustment is made relatively late in the fabrication process. A masking step selectively provides blocking elements to prevent the diffusion from occurring in certain FETS.

In U.S. Pat. No. 5,933,721 issued to Hause, et al., on 3 Aug. 1999, entitled, "METHOD FOR FABRICATING DIFFERENTIAL THRESHOLD VOLTAGE TRANSISTOR PAIR," a dopant is introduced into the gate electrode of each transistor of the pair. The dopant is differentially diffused into respective channel regions to provide a differential dopant concentration therebetween, which results in a differential threshold voltage between the two transistors.

In U.S. Pat. No. 5,942,786 issued to Sheu, et al., on 24 Aug. 1999, entitled, "VARIABLE WORK FUNCTION TRANSISTOR HIGH DENSITY MASK ROM," a work function of the gates is selected for each potential transistor, which, in turn, selects the threshold voltage for the transistor. P-type and n-type polysilicon are the different work function materials used as gate materials to selectively produce transistors having different threshold voltages. However, each gate material type is dedicated to a single transistor. No attempt is made to combine different gate materials having different work functions for altering the threshold voltage of an individual transistor. Nor is any attempt made to pattern the geometry of this gate material to accommodate shorter channel lengths and different threshold voltage values for individual transistors on the same wafer using a plurality of gate materials.

By placing gates on multi-sides of the FET channel, numerous researchers have theoretically and experimentally shown improvements in FET performance. As miniaturization continues, the supply voltages are required to be smaller. Thus, the magnitude of the threshold voltage must also decrease. Current designs require a thin channel region, $t_{si}$, on the order of 5–50 nm with gate lengths down to 20–200 nm, and $L_g$ approximately equal to 24 times $t_{si}$.

For the double-gate PETs where a very thin (<10 nm) silicon channel is utilized, it is possible and desirable to use an undoped silicon channel. However, the threshold voltage of such an FET would be entirely determined by its geometry and the work function of the gate material. It is often desirable to provide a variety of threshold voltages on the same chip for optimal circuit design. The present invention focuses on providing multiple threshold voltages on the same chip. The multiple threshold voltages are provided by different work functions of the gate materials and, importantly, by placing specific geometric restrictions on these materials in their layout to accommodate having these multiple threshold voltages on the same wafer.

Reported techniques for generating a dual-gated structure include simply defining the gate lithographically with high step heights, selective epitaxial growth to form an "air-bridge" silicon structure, and wrap-around gates with vertical carrier transport. However, introducing multiple threshold voltages on the same wafer for very large scale integrated circuit chips requires a defmed geometry of predetermined gate materials in close proximity to one another.

Bearing in mind the problems and deficiencies of the prior art, it is therefore an object of the present invention to provide a method for providing a variety of threshold voltages on the same integrated circuit chip for optimal circuit design that allows for an undoped or lightly doped silicon channel.

It is another object of the present invention to provide a FET and method of making the same that minimizes the silicon channel thickness and the adverse effects of diffusion of high dopant materials.

A further object of the invention is to provide a FET and method of making the same that maintains a geometric relationship between each channel and the work functions or gate materials necessary to establish a threshold voltage.

Yet another object of the present invention is to provide a FET and method of making the same that achieves the desired threshold voltage for thin channel devices, such as those used in VLSI chips.

Still other advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a FE comprising: a multilayer substrate having a top surface; electrically coupled source regions and electrically coupled drain regions in the substrate; a channel region in the substrate between the source and the drain regions, having a plurality of gate regions there through for controlling current flow through the channel region, the gate regions each comprising a different gate material having an associated work function for the FET; and, the plurality of gate regions situated in a predetermined geometric pattern such that the different gate materials are adjacent to each other.

The multilayer substrate may further comprise: electrical contacts connected to the gate material, the contacts isolated by a silicide layer, a nitride layer, and an oxide layer; and, a boron phosphorous glass isolation layer.

The predetermined geometric pattern comprises a linear array of the plurality of gate regions having the different gate materials in close proximity to each other. Some of the associated work functions of the plurality of different gate materials are combined to form a first total work function, and others of the associated work functions are combined to form a second total work function different from the first total work function.

In a second aspect, the present invention is directed to an integrated circuit chip having a plurality of field effect transistors therein, the transistors having narrow channel thickness and different threshold voltages, the threshold voltages determined by combination and adjacent positioning of at least two different gate materials, wherein the gate materials represent at least two different work functions.

At least two different work functions are averaged to form one total work function for one of the plurality of field effect transistors. The integrated circuit chip further comprises placing the at least two different gate materials in a geometric pattern such that each of the different gate materials are adjacent and physically close to one another for the combination.

Each of the field effect transistors includes: a source region; a drain region electrically coupled to the source region; and, a channel region between the source region and the drain region having the at least two gate regions there through for controlling current flow through the channel region.

The geometric pattern comprises an array of the at least two different gate materials; the array having rows and columns of the different gate materials such that each of the different gate materials is adjacent to the other gate materials.

In a third aspect, the present invention relates to a method of fabricating a field effect transistor comprising the steps of: providing a substrate having a source layer thereon; forming a channel layer on the source layer; forming a drain layer on the channel layer; forming gate trenches through the channel and drain layers; forming a gate oxide layer in the gate trenches; disposing in at least one of the gate trenches a first gate material having a first work function, the first gate material for controlling a current flow through the channel layer in response to a voltage of the first gate material; and, disposing in at least another one of the gate trenches a second gate material having a second work function, the second gate material for controlling current flow through the channel layer in response to a voltage of the second gate material.

The method further includes aligning the first and second gate materials in close proximity to one another and combining the first and second work functions to form a threshold voltage different from the voltage of the first gate material and different from the voltage of the second gate material. Aligning further comprises placing the first and second gate materials in a linear array of rows and columns such that the first and second gate materials are adjacent to one another in each of the rows and columns.

In a fourth aspect, the present invention relates to a method of making field effect transistors on a wafer having a plurality of predetermined threshold voltages, comprising: providing a substrate having a top surface, an epitaxial layer, and pad film thereon; applying a source layer having a top surface to the pad film; applying a channel layer to the source layer; applying a drain layer to the channel layer; providing at least one isolation film to the drain layer; forming trenches through the layers down to the source layer top surface; expanding the trenches; oxidizing the wafer; etching the trench to be within the source layer and below the source layer top surface; providing a dummy filler to the trench; polishing the dummy filler to be coplanar with the isolation film; removing the dummy filler; masking the wafer to apply at least two different gate materials to the trenches; applying low resistance material to the at least two different gate materials to form an electrical contact; combining the at least two different gate materials to form a total work function for one of the predetermined threshold voltages; and, providing a final isolation barrier to the wafer leaving the electrical contact accessible for connection. The source layer may comprise highly doped silicon, and the channel layer may comprise silicon having a doping concentration less than the source layer. The drain layer may comprise silicon having a doping concentration greater than the channel layer. Forming the trenches further comprises aligning the trenches in a predetermined geometric pattern such that the trenches are in close proximity to one another. Masking the wafer to apply at least two different gate materials to the trenches further comprises aligning the mask in a predetermined geometry such that the different gate materials can be applied adjacent to one another. The method further comprises: stripping the isolation film; etching a space surrounding the electrical contact; and, applying a spacer nitride layer, a silicide layer, and an oxide fill layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
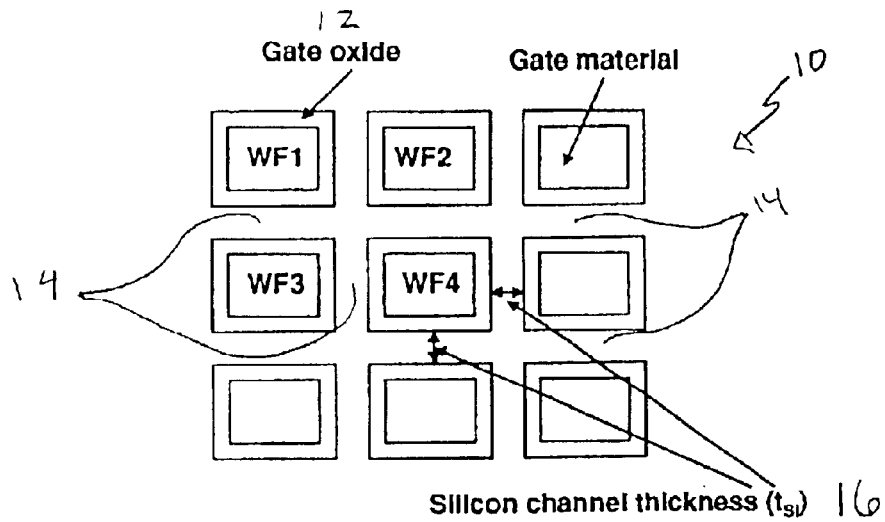
FIG. 1 is a top level view of a FET having a square gate, a rectangular channel, and multiple work functions.

In describing the preferred embodiment of the present invention, reference will be made herein to FIGS. 1–11 of the drawings in which like numerals refer to like features of the invention. Features of the invention are not necessarily shown to scale in the drawings.

The threshold voltage of a field effect transistor with a very thin silicon channel and surrounded by gate materials on, for example, four sides of a square, would be the threshold voltage due to the average of the work function of the gate materials on the four sides. The gate materials may be, for example, n$^+$ polysilicon gate, p$^+$ polysilicon gate, tungsten, TiN, and the like.

Figure 2:
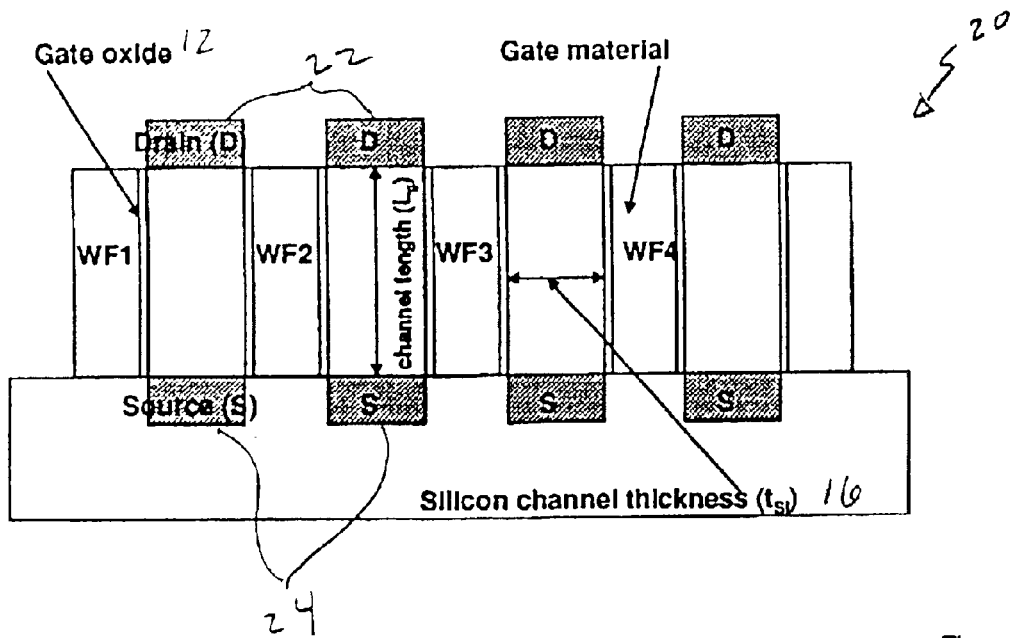
FIG. 2 is a cross-sectional view of a FET having gate material or work functions WF1–WF4 in a linear array with respect to each other.
Figure 3:
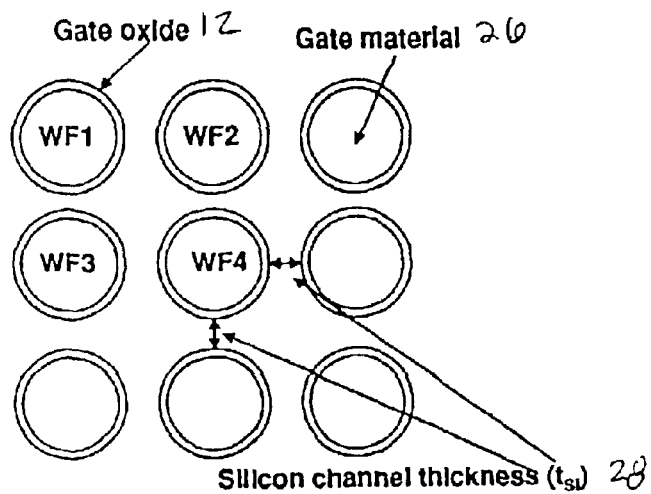
FIG. 3 is a top level view of the configuration corresponding to FIG. 1 with circularly patterned gate material.

FIG. 1 illustrates a top level view of FET 10 of the instant invention, having a square gate and rectangular channel. Gate oxide 12 surrounds different types of gate material with work functions WF1–WF4, respectively. The channel thickness of the silicon 16, t$_{si}$, is the linear distance between each gate oxide layers surrounding each gate material. Geometrically, each gate material is placed relative to other gate materials such that certain threshold voltages can be achieved through the averaging of the combination of the work functions of these materials. FIG. 2 shows the cross-sectional view of a FET 20 having gate material with work functions WF1–WF4, respectively, in a linear array with respect to each other. Drain 22 and source 24 regions of the FET are depicted above and below the gate material work functions WP1–WF4, respectively. The threshold voltage of the FET is determined by the combination or averaging of the work functions (WF1, WF2, WF3 and WF4). In practice, small square shapes are difficult to achieve in silicon fabrication technologies and most small shapes will ultimately be rounded into round shapes. FIG. 3 is a top level view of the configuration corresponding to FIG. 1 with circularly patterned gate material. In FIG. 3, the silicon channel material 28 situates between the round gate materials 26.

Figure 4:
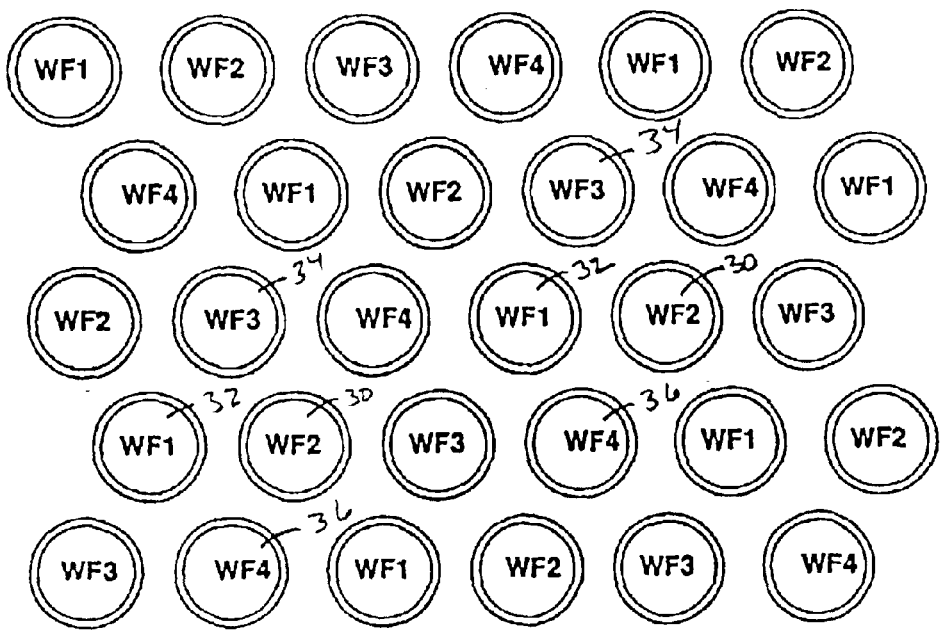
FIG. 4 is a top level view of a patterned array of circular work functions of different types where each work function is adjacent to the other work functions.

Importantly, it is desirable to obtain a thin silicon to control the channel potential. This requires shorter gate lengths, which in turn, requires strict control of the threshold voltage. The present invention accomplishes this geometrically by situating the gate material about the silicon in an array pattern as indicated in FIG. 4. A predetermined geometry of different work function material assures that each channel is gated by the same combination of work functions WF1–WF4. The desired embodiment allows the silicon channel thickness to be minimized. As illustrated in FIG. 4, each work function material is adjacent to the other three. For example, WF2 30 is situated adjacent to WF1 32, WF3 34, and WF4 36 respectively, throughout the geometry or pattern. Any geometry that situates different work function materials to be adjacent to one another may represent a working embodiment of the present invention. A plurality of different geometrical patterns may be used to accomplish this requirement, including, but not limited to, a linear array pattern.

Although FIG. 2 shows the FET as being vertical FETs, this concept of averaging the effect of multiple work functions in a predetermined geometric pattern to achieve the desired threshold voltage of a thin channel FET is a broad concept applicable to a FET in any configuration. A patterned linear array of work function material is illustrated by FIG. 4. Some other patterns, allowing each work function gate material to be adjacent to other corresponding work function gate materials, may also be successfully employed, such as circular patterns, triangular patterns, and different repetitive sequences of work function material, to name a few.

Figure 5:
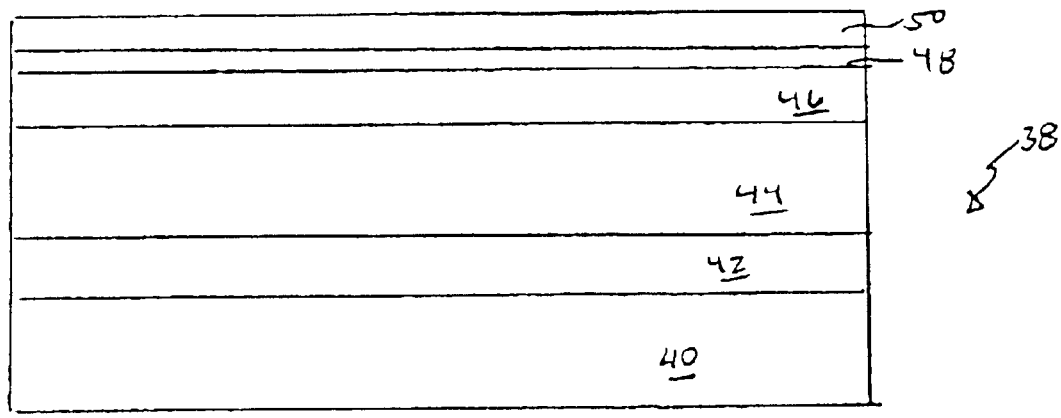
FIG. 5 is a cross-sectional view of a layered silicon wafer used to start the fabrication process of aligning multiple work functions for a FET.
Figure 6:
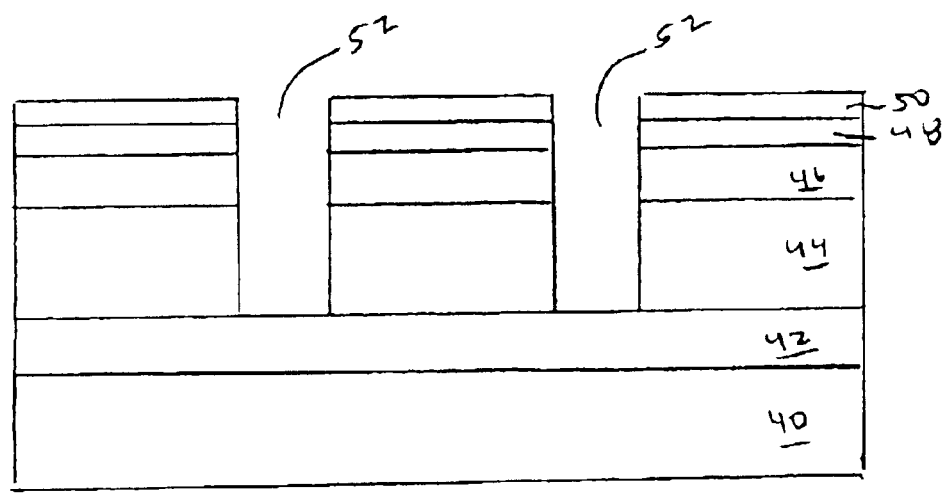
FIG. 6 is a cross-sectional view of the silicon wafer of FIG. 5 with trenches etched therein.

FIGS. 5–11 illustrate a method of making a field effect transistor according to the present invention having multiple work function materials patterned within the wafer such that a predetermined threshold voltage may be achieved using a narrow channel thickness. The method of fabricating the preferred embodiment of the present invention first starts with a silicon wafer 40 with epitaxial layers and pad films. FIG. 5 is a cross-sectional view of a layered silicon wafer used to start the fabrication process of aligning multiple gate materials with different work functions for a FET. A source silicon layer 42 is applied to the top surface of silicon wafer 40 and highly doped. Next a lightly doped channel layer 44 is applied. A drain silicon layer 46 is then added and highly doped (as compared to the doping concentration of the channel region). Materials for these layers are those typically employed in the art, such as silicon or silicon germanium alloy, and the like. Isolation or pad films of oxide 48 and nitride 50 are then added. The layered wafer 38 is then masked and etched to form trenches 52, as depicted in FIG. 6. These trenches represent the spaces for the added work function materials. The trenches are then aligned in geometric patterns enabling different work function materials to be adjacent to one another.

Figure 7:
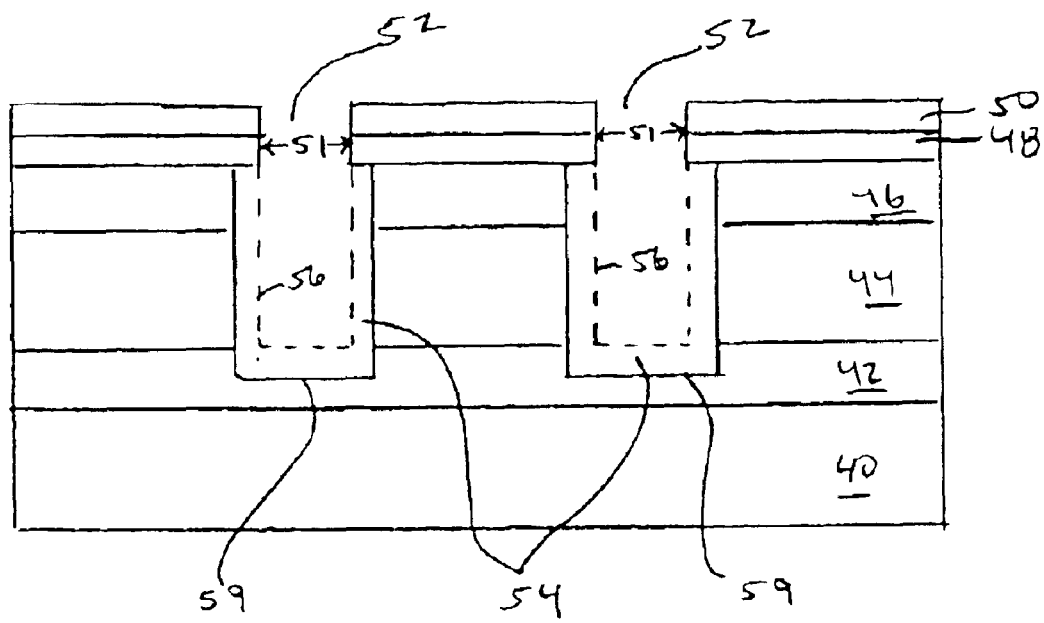
FIG. 7 illustrates the silicon wafer of FIG. 6 having etched, widened trenches and oxidation.
Figure 8:
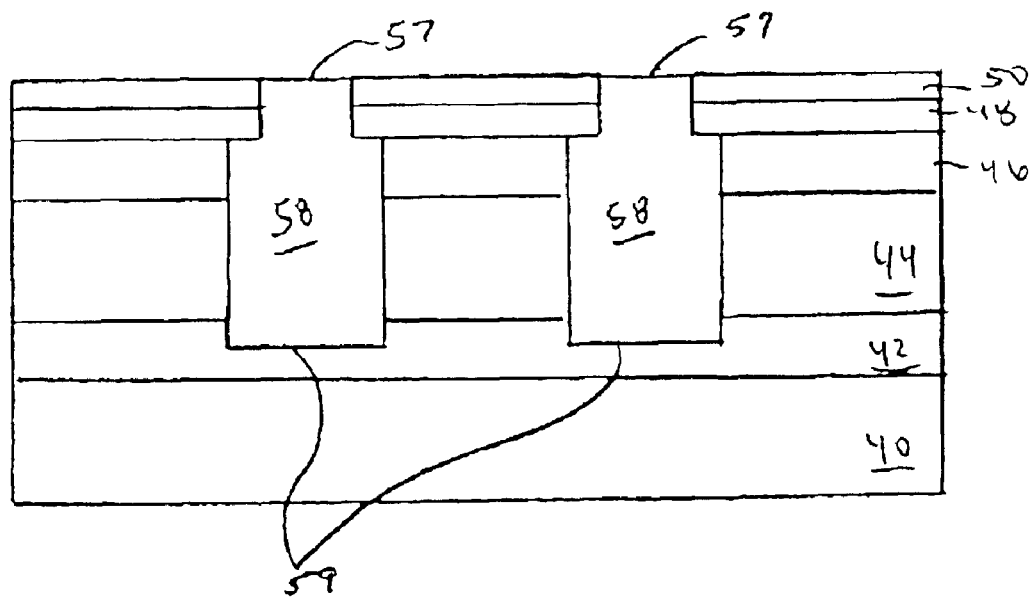
FIG. 8 represents the silicon wafer of FIG. 7 with a dummy filler applied to the trenches.

The trenches 52 are then expanded 54 by a chemical etch process, or the like, below the pad layers 48 and 50, such that the gap between pad layers forms a neck at the top of the trench 52, with a width 51 that is narrower than the width of the trench. The resultant etched wafer is then oxidized 56. FIG. 7 illustrates the silicon wafer having etched, widened trenches after oxidation. Trench bottom 59 is etched within source silicon layer 42. A filler 58, sometimes referred to as a dummy filler, is then applied to the trenches. Typically, arsenic doped glass is used, but any filler material compatible with the solutions, materials, and temperature of this process may be utilized. The dummy filler is then polished on the top surface 57 to be planar with the nitride layer 50. FIG. 8 represents the silicon wafer with the applied polished dummy filler.

Figure 9:
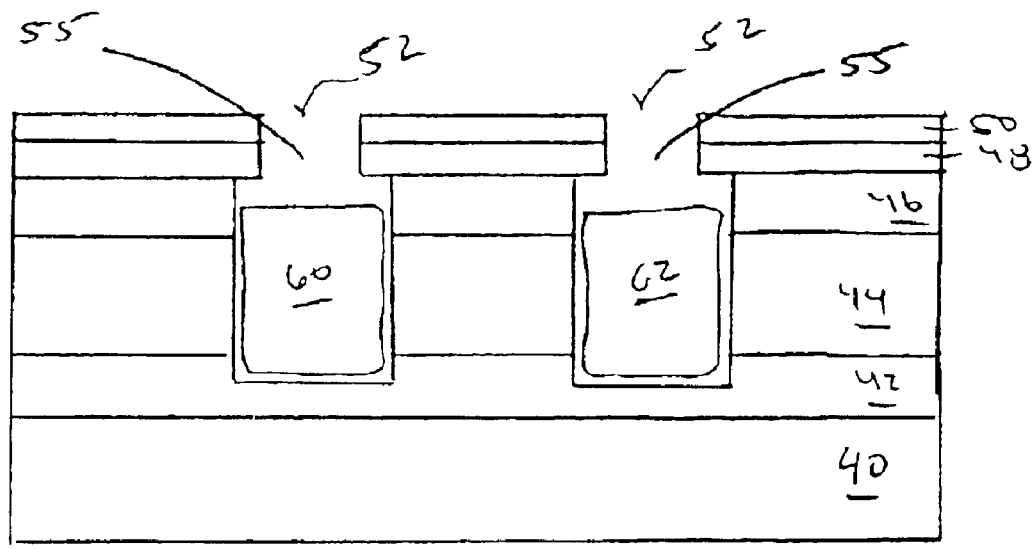
FIG. 9 depicts the silicon wafer of FIG. 8 with two different work functions applied within the trenches.

The resultant wafer is then masked in order to remove dummy filler 58. This may be accomplished by chemical etch or other established process. The trenches are cleaned and gate oxide 61 is applied to the empty trenches. Masking or blocking techniques, common in the art, are then employed to separately apply different gate materials 60, 62, such as polycrystalline silicon, to the trench holes. This process may be repeated for any number of different work function materials utilized. This material represents the work function material or gate material of the FET. Any metal material may be used in combination with other materials to achieve the desired averaging of the work functions for a predetermined threshold voltage value. FIG. 9 depicts the silicon wafer with two different work function materials 60, 62 within the trenches 52. As depicted in FIG. 9, work function materials 60, 62 are recessed within each trench 52, forming spaces 55.

Figure 10:
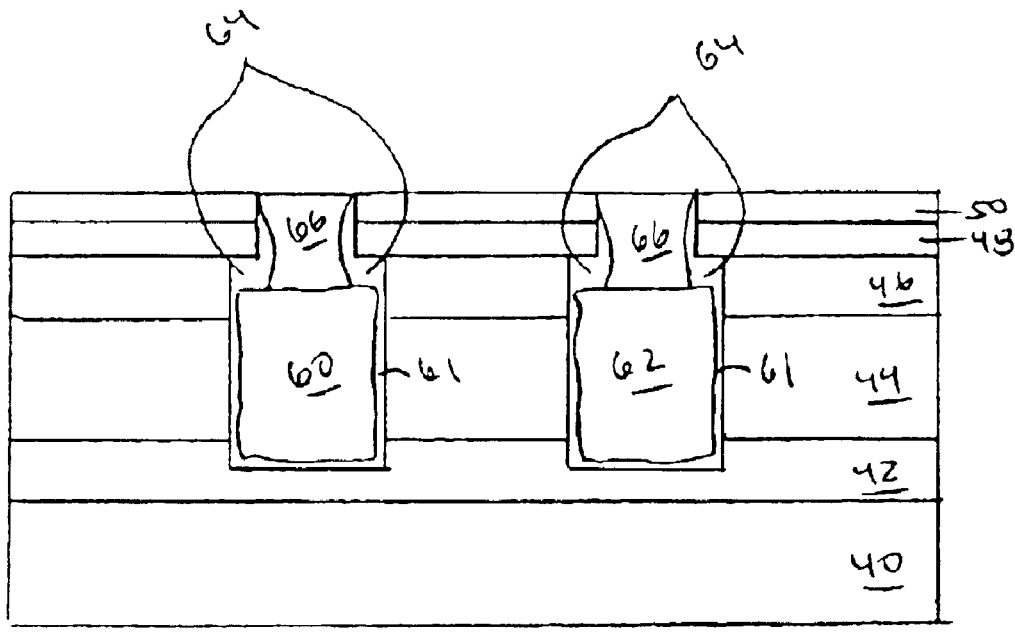
FIG. 10 is a cross-sectional view of the silicon wafer of FIG. 9 with electrical contacts applied to the top surface of the work function material.

Spaces 55 are then filled with a low resistive metal composition in contact with the work function material 60, 62 forming an electrical contact 66. Materials such as tungsten and the like, are typically used for these contacts. The contacts 66 must be an electrically low resistance material for electrical connection to the work function material. FIG. 10 illustrates the application of the electrical contacts 66. An oxide 64 is deposited in between the electrical contact and the wafer side walls as an isolation barrier.

Figure 11:
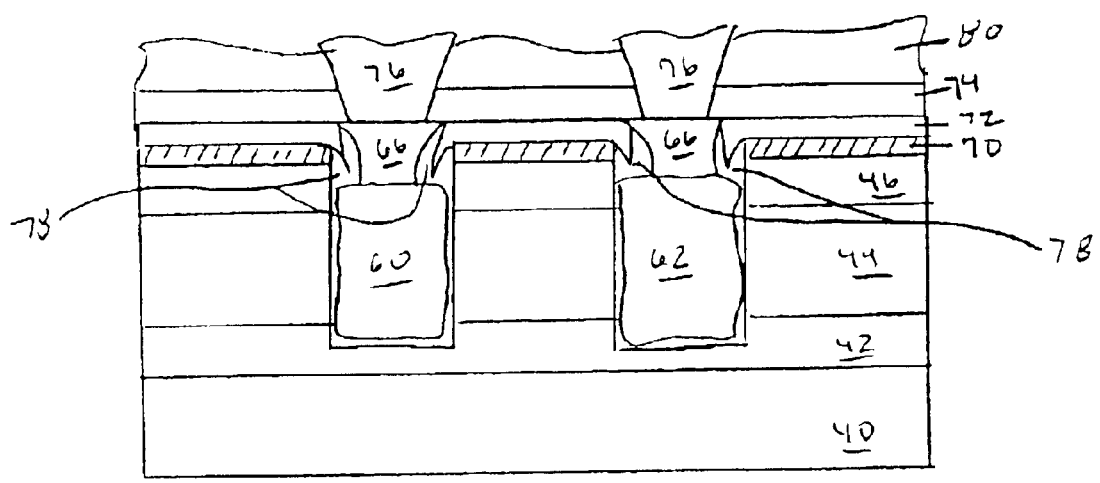
FIG. 11 is a cross-sectional view of the resultant layered silicon wafer of FIG. 10, having electrical contacts applied to the work function material, and isolation barriers imposed where electrical contact is not desired.

The nitride pad 50 is then stripped, etching is performed particularly guided within the space surrounding electrical contact 66. A spacer nitride 78 is applied where oxide 64 was previously located. A suicide layer 70 is then added along with an oxide fill layer 72. The isolation is completed with a nitride layer 74 added to the top surface of the oxide layer 72. Boron phosphorous silicon glass 80, or other isolation material, is then applied to the top surface as a final isolation barrier. Electrical contact spaces 76 are etched and more low resistance material, such as tungsten and the like, is filled in to form an electrical connection with contacts 66. FIG. 11 depicts the resultant layered silicon wafer with multiple gate materials combining for a total work function for the threshold voltage of a field effect transistor.

Importantly, the masking required to separately deposit different work function materials is governed by the desired predetermined geometric pattern that enables work functions of different materials to be in close physical proximity to one another for averaging, thereby achieving an array of different resultant threshold voltages.

The present invention allows for the fabrication of field effect transistors with a variety of threshold voltages on the same integrated circuit chip. By geometrically positioning different work function material about the wafer, the combination of these materials in close proximity to one another accommodates short channel length designs with diverse threshold voltage requirements on the same chip.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of fabricating a field effect transistor comprising the steps of:
   providing a substrate having a source layer thereon;
   forming a channel layer on said source layer;
   forming a drain layer on said channel layer;
   forming gate trenches through said channel and drain layers;
   forming a gate oxide layer in said gate trenches;
   disposing in at least one of said gate trenches a first gate material having a first work function, said first gate material for controlling a current flow through said channel layer in response to a voltage of said first gate material;
   disposing in at least another one of said gate trenches a second gate material having a second work function, said second gate material for controlling current flow through said channel layer in response to a voltage of said second gate material; and
   geometrically positioning said first and second work functions about said substrate such that each of said gate materials is gated by a combination of said associated work functions, allowing certain threshold voltages to be achieved through the combination of said work functions.

2. The method of claim 1 further comprising aligning said first and second gate materials in close proximity to one another and combining said first and second work functions to form a threshold voltage different from said voltage of said first gate material and different from said voltage of said second gate material.

3. The method of claim 2 wherein said aligning further comprises placing said first and second gate materials in a linear array of rows and columns such that said first and second gate materials are adjacent to one another in each of said rows and columns.

4. The method of claim 1 further comprising disposing in at least one other of said gate trenches at least one additional gate material having a different work function than any other of said work functions.

5. A method of making field effect transistors on a wafer having a plurality of predetermined threshold voltages, comprising:
   providing a substrate having a top surface, an epitaxial layer, and pad film thereon;
   applying a source layer having a top surface to said pad film;
   applying a channel layer to said source layer;
   applying a drain layer to said channel layer;
   providing at least one isolation film to said drain layer;
   geometrically positioning trenches through said layers down to said source layer top surface;
   expanding said trenches;
   oxidizing said wafer;
   etching said trench to be within said source layer and below said source layer top surface;
   providing a dummy filler to said trench;
   polishing said dummy filler to be coplanar with said isolation film;
   removing said dummy filler;
   masking said wafer to apply at least two different gate materials having different work functions to said trenches;
   applying low resistance material to said at least two different gate materials to form an electrical contact;
   combining said at least two different gate materials to form a total work function for one of said predetermined threshold voltages such that channel regions are gated by the same combination of said two different gate materials having said different work functions, allowing said predetermined threshold voltages to be achieved through the combination of said work functions; and, providing a final isolation barrier to said wafer leaving said electrical contact accessible for connection.

6. The method of claim 5 wherein said source layer comprises highly doped silicon.

7. The method of claim 6 wherein said channel layer comprises silicon having a doping concentration less than said source layer.

8. The method of claim 7 wherein said drain layer comprises silicon having a doping concentration greater than said channel layer.

9. The method of claim 5 wherein said at least one isolation film comprises a nitride layer.

10. The method of claim 5 wherein forming trenches further comprises masking said wafer and etching said trenches.

11. The method of claim 10 wherein forming said trenches further comprises aligning said trenches in a predetermined geometric pattern such that said trenches are in close proximity to one another.

12. The method of claim 5 wherein expanding said trenches further comprises applying a chemical etch and forming a neck in said trench.

13. The method of claim 5 wherein said dummy filler comprises arsenic doped glass.

14. The method of claim 5 wherein removing said dummy filler comprises performing a chemical etch process.

15. The method of claim 5 wherein masking said wafer to apply at least two different gate materials to said trenches further comprises aligning said mask in a predetermined geometry such that said different gate materials can be applied adjacent to one another.

16. The method of claim 5 further comprising:
stripping said isolation film;
etching a space surrounding said electrical contact; and,
applying a spacer nitride layer, a silicide layer, and an oxide fill layer.

17. The method of claim 5 wherein providing a final isolation barrier comprises providing a boron phosphorous silicon glass layer.

* * * * *